United States Patent
Song (10) Patent No.: US 12,354,984 B2
(45) Date of Patent: Jul. 8, 2025

(54) SEMICONDUCTOR DEVICE INCLUDING TWO OR MORE STACKED SEMICONDUCTOR STRUCTURES

(71) Applicant: SK hynix Inc., Gyeonggi-do (KR)

(72) Inventor: Choung Ki Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 444 days.

(21) Appl. No.: 18/077,495

(22) Filed: Dec. 8, 2022

(65) Prior Publication Data

US 2024/0021553 A1 Jan. 18, 2024

(30) Foreign Application Priority Data

Jul. 12, 2022 (KR) ........................ 10-2022-0085813

(51) Int. Cl.
*H01L 23/00* (2006.01)
*H01L 23/48* (2006.01)
*H01L 23/528* (2006.01)
*H01L 23/66* (2006.01)

(52) U.S. Cl.
CPC ............ *H01L 24/08* (2013.01); *H01L 23/481* (2013.01); *H01L 23/5286* (2013.01); *H01L 23/66* (2013.01); *H01L 2223/6616* (2013.01); *H01L 2224/08146* (2013.01)

(58) Field of Classification Search
CPC ... H01L 24/08; H01L 23/481; H01L 23/5286; H01L 23/66
See application file for complete search history.

(56) References Cited

U.S. PATENT DOCUMENTS

| | | | | |
|---|---|---|---|---|
| 8,390,382 B2* | 3/2013 | Kim | ........................ | H01L 24/49 |
| | | | | 330/68 |
| 8,421,528 B2* | 4/2013 | Kim | .................... | H01L 23/5286 |
| | | | | 327/546 |
| 9,594,464 B2* | 3/2017 | Nanbu | ................ | G06F 3/04164 |
| 11,171,082 B2* | 11/2021 | Kim | ..................... | H01L 23/3128 |
| 12,113,523 B2* | 10/2024 | Teraguchi | ............ | H03K 17/693 |
| 2006/0125072 A1* | 6/2006 | Mihara | ............... | H01L 23/5389 |
| | | | | 257/E21.705 |

(Continued)

FOREIGN PATENT DOCUMENTS

| | | | | | |
|---|---|---|---|---|---|
| CN | 100511600 C | * | 7/2009 | ............. | H01J 37/32 |
| CN | 102763266 A | * | 10/2012 | .......... | H01P 1/20363 |

(Continued)

*Primary Examiner* — Laura M Menz
(74) *Attorney, Agent, or Firm* — IP & T GROUP LLP (57) ABSTRACT

A semiconductor device may include: a first substrate; a first high-frequency signal through electrode and a first low-frequency signal through electrode passing through the first substrate; a first high-frequency signal conductive pattern and a first low-frequency signal conductive pattern respectively connected to the first high-frequency signal through electrode and the first low-frequency signal through electrode; and one or more first high-frequency signal connection electrodes and one or more first low-frequency signal connection electrodes respectively connected to the first high-frequency signal conductive pattern and the first low-frequency signal conductive pattern, wherein an area of the first low-frequency signal conductive pattern is larger than an area of the first high-frequency signal conductive pattern.

20 Claims, 9 Drawing Sheets

(56) References Cited

U.S. PATENT DOCUMENTS

| | | | | |
|---|---|---|---|---|
| 2007/0069272 | A1* | 3/2007 | Wakabayashi | H01L 24/19 |
| | | | | 257/777 |
| 2013/0324852 | A1* | 12/2013 | Onishi | A61B 8/4444 |
| | | | | 600/459 |
| 2015/0137238 | A1* | 5/2015 | Tsunemi | H10D 1/68 |
| | | | | 438/118 |
| 2017/0086299 | A1* | 3/2017 | Kang | H01G 4/008 |
| 2019/0164893 | A1* | 5/2019 | Kim | H01L 23/49827 |
| 2019/0189549 | A1* | 6/2019 | Jo | H01L 23/5389 |
| 2020/0137879 | A1* | 4/2020 | Liu | H01L 24/29 |
| 2020/0191857 | A1* | 6/2020 | Karino | H10D 1/47 |
| 2020/0294908 | A1* | 9/2020 | Haba | H01L 23/5223 |
| 2020/0328146 | A1* | 10/2020 | Kajiwara | H01L 23/3192 |
| 2021/0118852 | A1* | 4/2021 | Fay | H01L 21/78 |
| 2023/0082803 | A1* | 3/2023 | Karino | H01C 1/142 |
| | | | | 257/536 |
| 2024/0021553 | A1* | 1/2024 | Song | H01L 23/5286 |
| 2024/0097676 | A1* | 3/2024 | Teraguchi | H03K 17/687 |
| 2024/0404955 | A1* | 12/2024 | Seo | H01L 25/0657 |

FOREIGN PATENT DOCUMENTS

| | | | | |
|---|---|---|---|---|
| CN | 104081508 | A * | 10/2014 | H01L 21/768 |
| CN | 205847207 | U * | 12/2016 | |
| CN | 110710055 | A * | 1/2020 | H01Q 1/243 |
| CN | 107852148 | B * | 5/2021 | H03H 9/02559 |
| CN | 214959529 | U * | 11/2021 | H01L 23/538 |
| CN | 117393519 | A * | 1/2024 | H01L 23/481 |
| CN | 117749151 | A * | 3/2024 | H03K 17/687 |
| CN | 118712170 | A * | 9/2024 | H01L 23/481 |
| EP | 2814053 | A1 * | 12/2014 | H01L 21/768 |
| EP | 2851337 | A2 * | 3/2015 | B81C 99/002 |
| JP | 2006173232 | A * | 6/2006 | H01L 23/5389 |
| JP | 2006237337 | A * | 9/2006 | H01L 24/97 |
| JP | 2006245024 | A * | 9/2006 | |
| JP | 4552193 | B2 * | 9/2010 | |
| JP | 2018085389 | A * | 5/2018 | H01J 37/32706 |
| JP | 7239023 | B2 * | 3/2023 | H01L 23/4824 |
| JP | 2023043403 | A * | 3/2023 | H01C 1/142 |
| JP | 7279354 | B2 * | 5/2023 | G01B 11/02 |
| JP | 2024044571 | A * | 4/2024 | H03K 17/687 |
| KR | 10-2016-0016617 | A | 2/2016 | |
| WO | WO-2008018565 | A1 * | 2/2008 | H01P 1/2135 |
| WO | WO-2013118618 | A1 * | 8/2013 | H01L 21/768 |
| WO | WO-2014068811 | A1 * | 5/2014 | H01L 23/043 |
| WO | WO-2020179042 | A1 * | 9/2020 | |
| WO | WO-2023235616 | A1 * | 12/2023 | C22C 38/08 |
| WO | WO-2024130634 | A1 * | 6/2024 | G09G 3/32 |
| WO | WO-2024130652 | A1 * | 6/2024 | H01L 25/167 |

* cited by examiner

SEMICONDUCTOR DEVICE INCLUDING TWO OR MORE STACKED SEMICONDUCTOR STRUCTURES

CROSS-REFERENCE TO RELATED APPLICATION

This application claims priority under 35 U.S.C. § 119 to Korean Patent Application No. 10-2022-0085813 filed on Jul. 12, 2022, which is incorporated herein by reference in its entirety.

BACKGROUND

1. Technical Field

This patent document relates generally to semiconductor technology and, more particularly, to a semiconductor device including two or more stacked semiconductor structures.

2. Related Art

Consumers of electronic products require higher-capacity data processing and smaller size devices. Accordingly, semiconductor structures such as semiconductor chips and wafers used in these electronic products are also required to have thinner thicknesses and occupy smaller areas. Furthermore, the form in which a plurality of semiconductor structures are embedded in one semiconductor device is also affected.

Three dimensional semiconductor devices employ a plurality of semiconductor structures vertically stacked on each other in various three-dimensional arrangements and provide electrical connections between their various components. Three dimensional semiconductor devices are relatively new and are currently the subject of extensive research and developments for improving their structural integrity, performance characteristics and space requirements.

SUMMARY

In an embodiment, a semiconductor device may include: a first substrate; a first high-frequency signal through electrode and a first low-frequency signal through electrode passing through the first substrate; a first high-frequency signal conductive pattern and a first low-frequency signal conductive pattern respectively connected to the first high-frequency signal through electrode and the first low-frequency signal through electrode; and one or more first high-frequency signal connection electrodes and one or more first low-frequency signal connection electrodes respectively connected to the first high-frequency signal conductive pattern and the first low-frequency signal conductive pattern, wherein an area of the first low-frequency signal conductive pattern is larger than an area of the first high-frequency signal conductive pattern.

In another embodiment, a semiconductor device may include: a first substrate; a first high-frequency signal through electrode and a first low-frequency signal through electrode passing through the first substrate; a first high-frequency signal conductive pattern and a first low-frequency signal conductive pattern respectively connected to the first high-frequency signal through electrode and the first low-frequency signal through electrode; and one or more first high-frequency signal connection electrodes and one or more first low-frequency signal connection electrodes respectively connected to the first high-frequency signal conductive pattern and the first low-frequency signal conductive pattern, wherein a contact area between the first low-frequency signal conductive pattern and the first low-frequency signal connection electrode is larger than a contact area between the first high-frequency signal conductive pattern and the first high-frequency signal connection electrode.

DETAILED DESCRIPTION

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description, a semiconductor structure may mean, for example, a semiconductor chip, a wafer, or the like including a circuit and/or a wiring structure that performs a predetermined function. Also, a semiconductor device may include two or more semiconductor structures stacked over of each other, for example, in a vertical direction and electrically connected to each other.

Figure 1A:
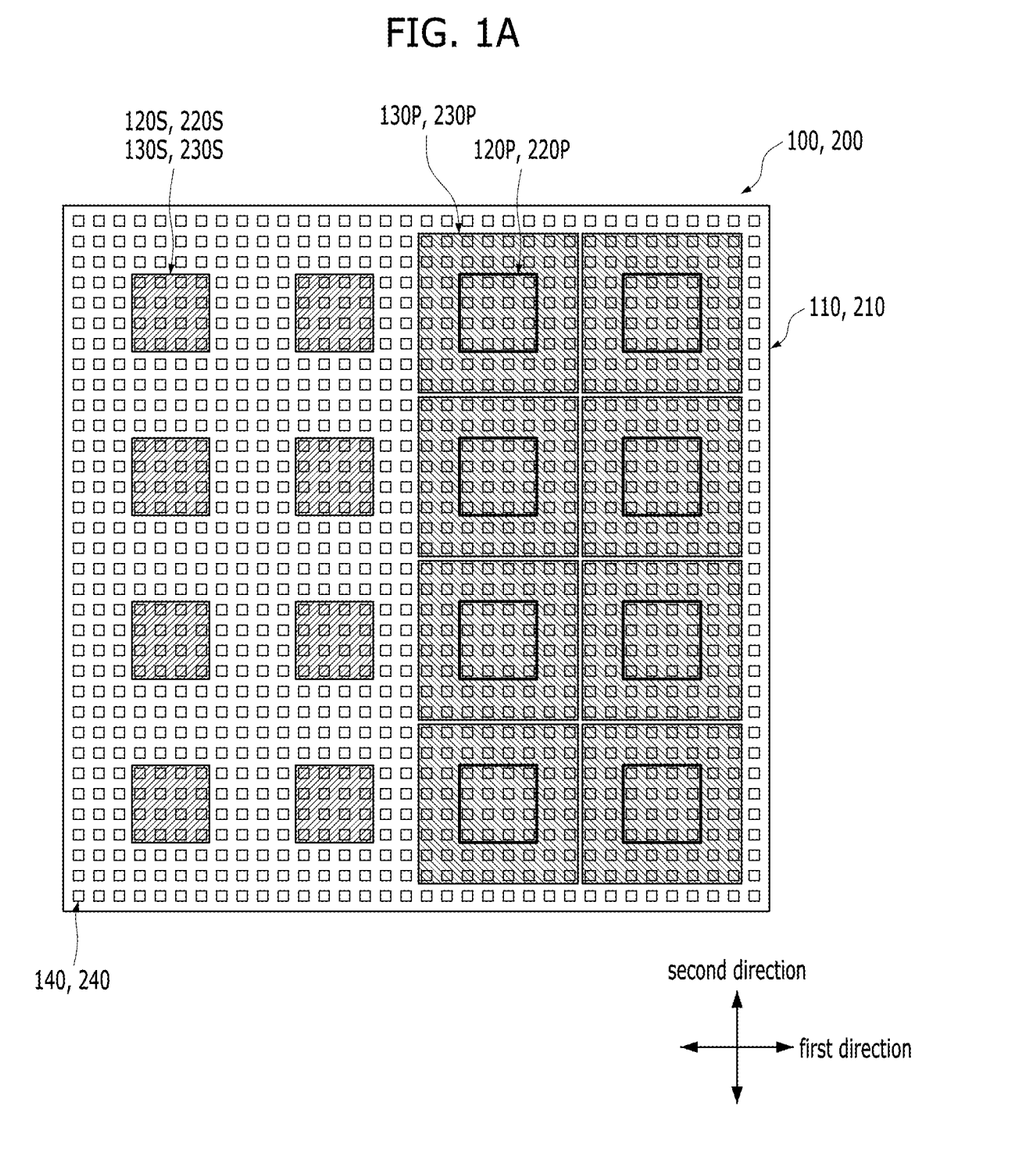
FIG. 1A is a plan view schematic illustrating a semiconductor device according to an embodiment of the present disclosure.
Figure 1B:
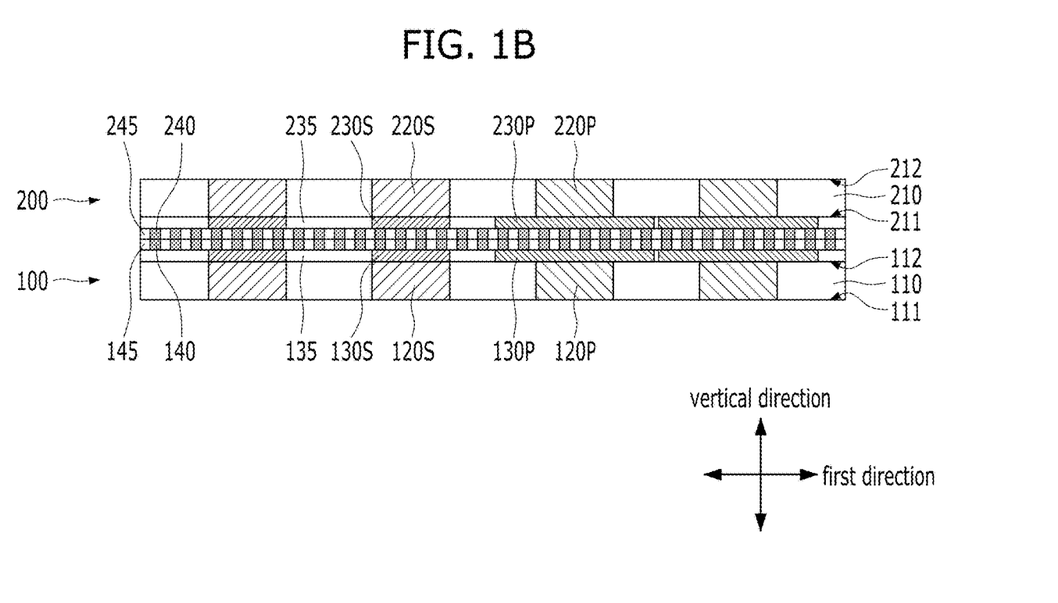
FIG. 1B is a cross-sectional view schematic of the semiconductor device of FIG. 1A in a first direction.

FIG. 1A is a plan view schematic illustrating a semiconductor device according to an embodiment of the present disclosure, and FIG. 1B is a cross-sectional view schematic of the semiconductor device of FIG. 1A in a first direction.

Referring to FIGS. 1A and 1B, the semiconductor device of the present embodiment may include a first semiconductor structure 100 and a second semiconductor structure 200 stacked over of each other, for example, in a vertical direction.

The first semiconductor structure 100 may include a first substrate 110, a first high-frequency signal through electrode 120S, a first low-frequency signal through electrode 120P, a first high-frequency signal conductive pattern 130S, a first low-frequency signal conductive pattern 130P, a first interlayer insulating layer 135, a first connection electrode 140, and a first insulating layer 145.

The first substrate 110 may include a semiconductor material such as silicon or germanium, and may have a first surface 111, a second surface 112, and a side surface connecting them. The first substrate 110 may be disposed such that the first surface 111 faces downward and the second surface 112 faces upward in the vertical direction. Furthermore, the first substrate 110 may further include a circuit/wiring structure implemented in various ways according to the type of the first semiconductor structure 100. For example, when the first semiconductor structure 100 includes volatile memory such as dynamic random access memory (DRAM) or static RAM (SRAM), or non-volatile memory such as NAND flash, resistive RAM (RRAM), phase-change RAM (PRAM), magneto-resistive RAM (MRAM), or ferroelectric RAM (FRAM), the circuit/wiring structure may include a memory cell array including a plurality of memory cells. Alternatively, for example, when the first semiconductor structure 100 is a controller or a logic device that drives the memory, the circuit/wiring structure may include a circuit that drives the memory cell array. The circuit/wiring structure may be disposed adjacent to any one of the first surface 111 or the second surface 112, and may be electrically connected to the first high-frequency signal through electrode 120S and the first low-frequency signal through electrode 120P.

The first high-frequency signal through electrode 120S and the first low-frequency signal through electrode 120P may extend between the first surface 111 and the second surface 112 of the first substrate 110 to have a pillar shape passing through the first substrate 110. As an example, the first high-frequency signal through electrode 120S and the first low-frequency signal through electrode 120P may include a through silicon via (TSV). In addition, the first high-frequency signal through electrode 120S and the first low-frequency signal through electrode 120P may include various conductive materials, for example, a metal or a metal compound.

The first high-frequency signal through-electrode 120S and the first low-frequency signal through-electrode 120P may be used as a transmission path of various signals required for driving a semiconductor device. As an example, when the semiconductor device includes memory, signals such as a data input/output signal DQ, a command/address signal CA, or a chip select signal CS may move through the first high-frequency signal through electrode 120S and the first low-frequency signal through electrode 120P. Furthermore, the first high-frequency signal through electrode 120S may be used to transmit a signal that operates at a higher-frequency than a signal transmitted through the first low-frequency signal through electrode 120P. In other words, a toggle period of a signal transmitted through the first high-frequency signal through electrode 120S may be shorter than a toggle period of a signal transmitted through the first low-frequency signal through electrode 120P. A signal transmitted through the first low-frequency signal through electrode 120P may include power required for driving a semiconductor device, for example, a power voltage of various levels or a ground voltage. Since the power is not toggled, it may be regarded as a signal having a lower-frequency characteristic than a signal transmitted through the first high-frequency signal through electrode 120S. In the present embodiment, in a plan view, eight first high-frequency signal through electrodes 120S are arranged in a 2*4 shape along a first direction and a second direction substantially perpendicular to the first direction on the left side of the first semiconductor structure 100, and eight first low-frequency signal through-electrodes 120P are arranged in a 2*4 shape along the first direction and the second direction on the right side of the first semiconductor structure, but the present disclosure is not limited thereto. The position, number, arrangement, or the like of the first high-frequency signal through electrodes 120S and the first low-frequency signal through electrodes 120P may be variously modified. In addition, in the present embodiment, in a plan view, the first high-frequency signal through-electrode 120S and the first low-frequency signal through-electrode 120P have a square shape, but the present disclosure is not limited thereto. The planar shapes of the first high-frequency signal through electrode 120S and the first low-frequency signal through electrode 120P may be variously modified, such as a rectangle, a circle, an oval, and the like. Areas of the first high-frequency signal through-electrode 120S and the first low-frequency signal through-electrode 120P may be the same as each other, in a plan view.

Over the second surface 112 of the first substrate 110, a first high-frequency signal conductive pattern 130S electrically connected to the first high-frequency signal through electrode 120S, and a first low-frequency signal conductive pattern 130P electrically connected to the first low-frequency signal through electrode 120P may be formed. The first high-frequency signal conductive pattern 130S may overlap each of the plurality of first high-frequency signal through electrodes 120S, and the first low-frequency signal conductive pattern 130P may overlap each of the plurality of first low-frequency signal through electrodes 120P. In the present embodiment, the first high-frequency signal conductive pattern 130S is in direct contact with the upper surface of the first high-frequency signal through electrode 120S, and the first low-frequency signal conductive pattern 130P is in direct contact with the upper surface of the first low-frequency signal through electrode 120P, but the present disclosure is not limited thereto. In another embodiment, another connection structure may be interposed between the first high-frequency signal conductive pattern 130S and the first high-frequency signal through electrode 120S, and between the first low-frequency signal conductive pattern 130P and the first low-frequency signal through electrode 120P. For example, when the above-described circuit/wiring structure of the first substrate 110 is disposed adjacent to the second surface 112, the first high-frequency signal through electrode 120S and the first low-frequency signal through electrode 120P may be electrically connected to the first high-frequency signal conductive pattern 130S and the first low-frequency signal conductive pattern 130P, respectively, through the circuit/wiring structure.

Here, the area of the first low-frequency signal conductive pattern 130P may be larger than the area of the first high-frequency signal conductive pattern 130S in a plan view. In this case, as will be described later, the number of first connection electrodes 140 connected to the first low-frequency signal conductive pattern 130P may be greater than the number of first connection electrodes 140 connected to the first high-frequency signal conductive pattern 130S. In other words, the contact area between the first low-frequency signal conductive pattern 130P and the first connection electrode 140 may be larger than the contact area between the first high-frequency signal conductive pattern 130S and the first connection electrode 140. In the present embodiment, in a plan view, the first high-frequency signal conductive pattern 130S has the same shape and area as the first high-frequency signal through electrode 120S, and the first low-frequency signal conductive pattern 130P has a larger area than the first low-frequency signal through electrode 120P while having the same shape as the first low-frequency signal through electrode 120P. However, the present disclosure is not limited thereto, and on the premise that the first low-frequency signal conductive pattern 130P has a larger area than the first high-frequency signal conductive pattern 130S and/or the first low-frequency signal through electrode 120P in a plan view, the shape or area of the first low-frequency signal conductive pattern 130P and the first high-frequency signal conductive pattern 130S may be variously modified.

The first high-frequency signal conductive pattern 130S and the first low-frequency signal conductive pattern 130P may include various conductive materials, for example, a metal or a metal compound.

A first interlayer insulating layer 135 may fill a space between the first high-frequency signal conductive pattern 130S and the first low-frequency signal conductive pattern 130P over the second surface 112 of the first substrate 110. The first interlayer insulating layer 135 may include various insulating materials such as silicon oxide, silicon nitride, or a combination thereof.

The first connection electrode 140 may be formed over the first high-frequency signal conductive pattern 130S, the first low-frequency signal conductive pattern 130P, and the first interlayer insulating layer 135. In a plan view, a plurality of first connection electrodes 140 may have a substantially constant area, and may be formed over the first high-frequency signal conductive pattern 130S, the first low-frequency signal conductive pattern 130P, and the first interlayer insulating layer 135 with a substantially constant pitch. For example, the plurality of first connection electrodes 140 may be arranged in a matrix form along the first direction and the second direction. For reference, the pitch may mean a distance between a center of one component and a center of another adjacent component thereto, in a plan view. In addition, the first connection electrode 140 may have a smaller area than the first high-frequency signal conductive pattern 130S and the first low-frequency signal conductive pattern 130P, so that the plurality of first connection electrodes 140 may be connected to the first high-frequency signal conductive pattern 130S, and the plurality of first connection electrodes 140 may be connected to the first low-frequency signal conductive pattern 130P. The first connection electrode 140 connected to the first high-frequency signal conductive pattern 130S may be referred to as a first high-frequency signal connection electrode, and may be used as a path for transmitting a high-frequency signal. The first connection electrode 140 connected to the first low-frequency signal conductive pattern 130P may be referred to as a first low-frequency signal connection electrode, and may be used as a path for transmitting a low-frequency signal, for example, a power supply path. The rest of the first connection electrodes 140, that is, the first connection electrodes 140 overlapping and/or contacting the first interlayer insulating layer 135 may correspond to a dummy that does not perform an electrical function. The first connection electrode 140, which corresponds to a dummy, may be omitted.

Here, since the area of the first low-frequency signal conductive pattern 130P is larger than the area of the first high-frequency signal conductive pattern 130S in a plan view, the number of the first connection electrodes 140 connected to the first low-frequency signal conductive pattern 130P may be greater than the number of the first connection electrodes 140 connected to the first high-frequency signal conductive pattern 130S. As a result, the total contact area between the first low-frequency signal conductive pattern 130P and the plurality of first connection electrodes 140 may be larger than the total contact area between the first high-frequency signal conductive pattern 130S and the plurality of first connection electrodes 140. In the present embodiment, one first low-frequency signal conductive pattern 130P and 64 first connection electrodes 140 are in contact with each other, and one first high-frequency signal conductive pattern 130S and 16 first connection electrodes 140 are in contact with each other, but the present disclosure is not limited thereto. The number of the first connection electrodes 140 connected to each of the first low-frequency signal conductive pattern 130P and the first high-frequency signal conductive pattern 130S may be variously modified.

The first connection electrode 140 may include various conductive materials. In particular, when the first connection electrode 140 is directly bonded to a second connection electrode 240 of the second semiconductor structure 200 to be described later to form a hybrid bonding structure, the first connection electrode 140 may include a metal material capable of being combined with the second connection electrode 240 by inter-diffusion of the metal through a high-temperature annealing process. For example, the first connection electrode 140 may include copper (Cu), nickel (Ni), tin (Sn), gold (Au), silver (Ag), a combination thereof, or a compound of these metals.

The first insulating layer 145 may fill a space between the first connection electrodes 140 over the first high-frequency signal conductive pattern 130S, the first low-frequency signal conductive pattern 130P, and the first interlayer insulating layer 135. The first insulating layer 145 may include various insulating materials. In particular, when the first insulating layer 145 is directly bonded to a second insulating layer 245 of the second semiconductor structure 200 to be described later to form a hybrid bonding structure, the first insulating layer 145 may include an insulating material capable of being combined with the second insulating layer 245 by covalent bonding between insulating materials. For example, the first insulating layer 145 may include silicon oxide or silicon nitride.

The second semiconductor structure 200 may include a second substrate 210, a second high-frequency signal through electrode 220S, a second low-frequency signal through electrode 220P, a second high-frequency signal conductive pattern 230S, a second low-frequency signal conductive pattern 230P, a second interlayer insulating layer 235, a second connection electrode 240, and a second insulating layer 245.

The second semiconductor structure 200 may be electrically connected to the first semiconductor structure 100 while being disposed over the first semiconductor structure 100. The second substrate 210 of the second semiconductor structure 200 may be substantially the same as the first substrate 110 of the first semiconductor structure 100. That is, the second substrate 210 may include a circuit/wiring structure that performs the same function as the first substrate 110, and the circuit/wiring structure of the second substrate 210 may have substantially the same position of the circuit/wiring structure of the first substrate 110. However, the present disclosure is not limited thereto, and the second substrate 210 may include a circuit/wiring structure that performs a function different from that of the first substrate 110. For example, the first substrate 110 may include a memory cell array, and the second substrate 210 may include a different memory cell array from the memory cell array of the first substrate 110 or a driving circuit for driving the memory cell array of the first substrate 110. Alternatively, for example, the second substrate 210 may include a memory cell array, and the first substrate 110 may include a different memory cell array from the memory cell array of the second substrate 210 or a driving circuit for driving the memory cell array of the second substrate 210. Alternatively, for example, the first substrate 110 and the second substrate 210 may include the same circuit/wiring structure, but the positions thereof may be opposite to each other. That is, the circuit/wiring structure of the first substrate 110 may be adjacent to the first surface 111 while the circuit/wiring structure of the second substrate 210 may be adjacent to the second surface 212, or the circuit/wiring structure of the substrate 110 may be adjacent to the second surface 112 while the circuit/wiring structure of the second substrate 210 may be adjacent to the first surface 211.

For electrical connection between the first semiconductor structure 100 and the second semiconductor structure 200, the second high-frequency signal conductive pattern 230S, the second low-frequency signal conductive pattern 230P, and the second interlayer insulating layer 235 of the second semiconductor structure 200 may be disposed under the first surface 211 of the second substrate 210, facing the first semiconductor structure 100, and the second connection electrode 240 and the second insulating layer 245 may be disposed under the second high-frequency signal conductive pattern 230S, the second low-frequency signal conductive pattern 230P, and the second interlayer insulating layer 235. Except for this, since these components of the second semiconductor structure 200 may be substantially the same as those described in the first semiconductor structure 100, a detailed description thereof will be omitted.

When a high-temperature heat treatment process is performed in a state in which the second semiconductor structure 200 is disposed over the first semiconductor structure 100 and the first connection electrode 140 and the second connection electrode 240 are in contact with each other, the first connection electrode 140 and the second connection electrode 240 may form a metal-to-metal bonding by interdiffusion of the metal. In addition, the first insulating layer 140 and the second insulating layer 240 may form an insulator-to-insulator bonding by covalent bonding between insulating materials.

According to the first semiconductor structure 100 described above, by increasing the number and/or area of the first connection electrodes 140 connected to the first low-frequency signal through electrode 120P using the first low-frequency signal conductive pattern 130P having a relatively large area, it may be possible to reduce the resistance of a low-frequency signal transmission path, for example, a power supply path. In addition, by reducing the number and/or area of the first connection electrodes 140 connected to the first high-frequency signal through electrode 120S by using the first high-frequency signal conductive pattern 130S having a relatively small area, it may be possible to reduce the capacitance of a high-frequency signal transmission path. Similarly, in the second semiconductor structure 200, the resistance of a low-frequency signal transmission path, for example, a power supply path and the capacitance of a high-frequency signal transmission path may be reduced. As a result, in the semiconductor device including the first semiconductor structure 100 and the second semiconductor structure 200, power supply capability may be improved, and high-speed signal transmission may be possible.

Meanwhile, when the first semiconductor structure 100 is connected to other components disposed under the first semiconductor structure 100, conductive components electrically connected to the first high-frequency signal through electrode 120S and the first low-frequency signal through electrode 120P may be disposed under the first semiconductor structure 100. For example, a structure symmetrical to the first high-frequency signal conductive pattern 130S, the first low-frequency signal conductive pattern 130P, the first interlayer insulating layer 135, the first connection electrode 140, and the first insulating layer 145, which are disposed over the second surface 112 of the first substrate 110, may be disposed under the first surface 111 of the first substrate 110. In addition, when the second semiconductor structure 200 is connected to other components disposed over the second semiconductor structure 200, conductive components electrically connected to the second high-frequency signal through electrode 220S and the second low-frequency signal through electrode 220P may be disposed over the second semiconductor structure 200. For example, a structure symmetrical to the second high-frequency signal conductive pattern 230S, the second low-frequency signal conductive pattern 230P, the second interlayer insulating layer 235, the second connection electrode 240, and the second insulating layer 245, which are disposed under the first surface 211 of the second substrate 210, may be disposed over the second surface 212 of the second substrate 210.

Figure 2A:
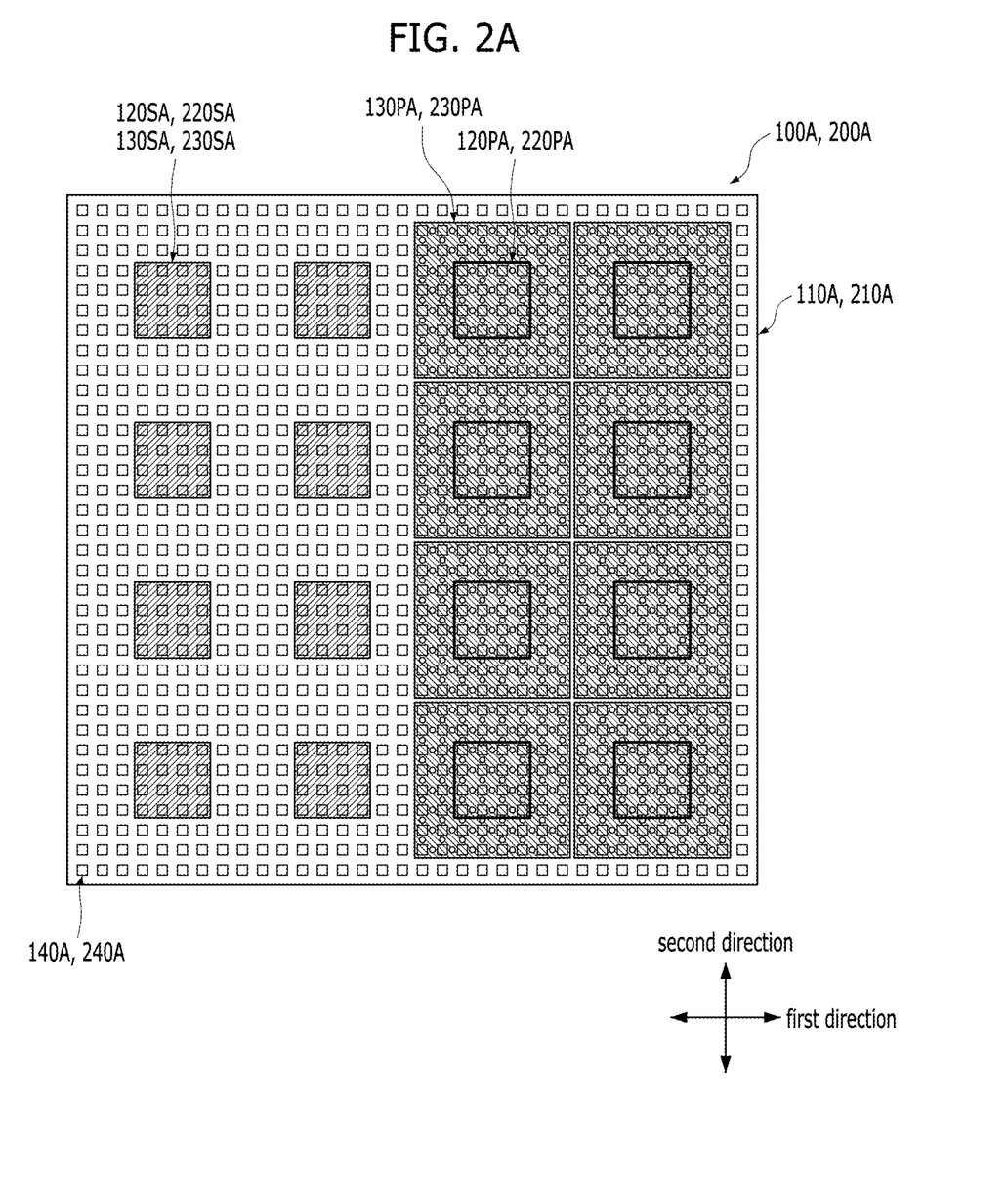
FIG. 2A is a plan view schematic illustrating a semiconductor device according to another embodiment of the present disclosure.
Figure 2B:
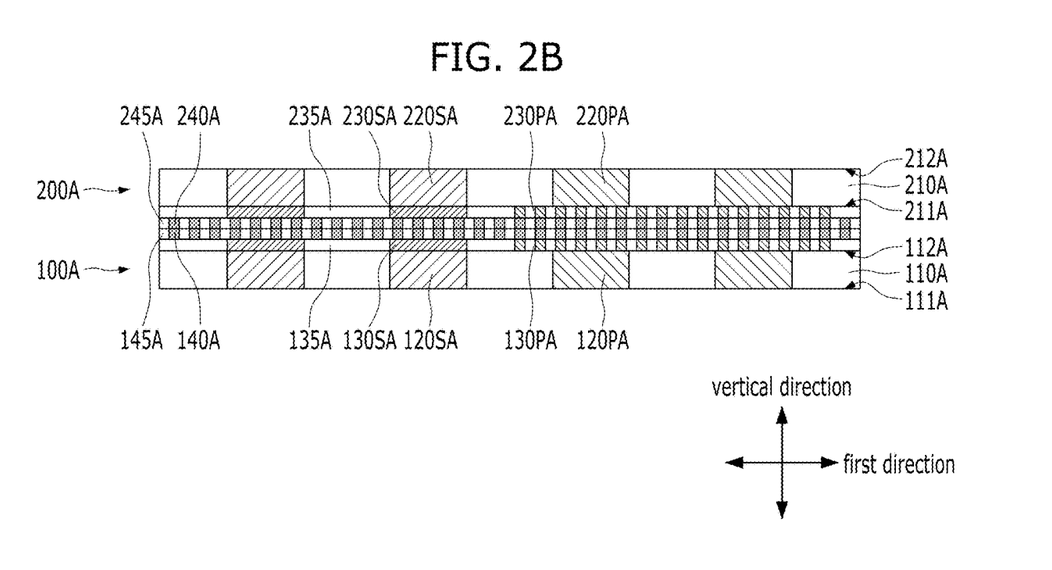
FIG. 2B is a cross-sectional view schematic of the semiconductor device of FIG. 2A in a first direction.

FIG. 2A is a plan view schematic illustrating a semiconductor device according to another embodiment of the present disclosure, and FIG. 2B is a cross-sectional view schematic of the semiconductor device of FIG. 2A in a first direction. Differences from the above-described embodiment will be mainly described.

Referring to FIGS. 2A and 2B, the semiconductor device of the present embodiment may include a first semiconductor structure 100A and a second semiconductor structure 200A stacked over of each other, for example, in a vertical direction.

The first semiconductor structure 100A may include a first substrate 110A, a first high-frequency signal through electrode 120SA, a first low-frequency signal through electrode 120PA, a first high-frequency signal conductive pattern 130SA, and a first low-frequency signal conductive pattern 130PA, a first interlayer insulating layer 135A, a first connection electrode 140A, and a first insulating layer 145A.

Here, the first low-frequency signal conductive pattern 130PA may have a lattice shape in a plan view, unlike the above-described embodiment. That is, the first low-frequency signal conductive pattern 130PA may include a plurality of holes arranged to have a predetermined rule in a flat plate. The first connection electrode 140A may be in contact with a remaining portion other than the holes of the first low-frequency signal conductive pattern 130PA. Even in this case, since the area of the first low-frequency signal conductive pattern 130PA is larger than the area of the first high-frequency signal conductive pattern 130SA in a plan view, the number of the first connection electrodes 140A connected to the first low-frequency signal conductive pattern 130PA may be greater than the number of the first connection electrodes 140A connected to the first high-frequency signal conductive pattern 130SA.

The second semiconductor structure 200A may include a second substrate 210A, a second high-frequency signal through electrode 220SA, a second low-frequency signal through electrode 220PA, a second high-frequency signal conductive pattern 230SA, a second low-frequency signal conductive pattern 230PA, a second interlayer insulating layer 235A, a second connection electrode 240A, and a second insulating layer 245A.

Here, the second low-frequency signal conductive pattern 230PA may have a lattice shape in a plan view. That is, the second low-frequency signal conductive pattern 230PA may include a plurality of holes arranged to have a predetermined rule in a flat plate. The second connection electrode 240A may be in contact with a remaining portion other than the holes of the second low-frequency signal conductive pattern 230PA. Even in this case, since the area of the second low-frequency signal conductive pattern 230PA is larger than the area of the second high-frequency signal conductive pattern 230SA in a plan view, the number of the second connection electrode 240A connected to the second low-frequency signal conductive pattern 230PA may be greater than the number of second connection electrodes 240A connected to the second high-frequency signal conductive pattern 230SA.

In the present embodiment, the case where the first low-frequency signal conductive pattern 130PA and the second low-frequency signal conductive pattern 230PA have the same lattice shape is illustrated, but the present disclosure is not limited thereto. Each of the first low-frequency signal conductive pattern 130PA and the second low-frequency signal conductive pattern 230PA may have any one of a flat plate shape and a lattice shape, independently.

Figure 3A:
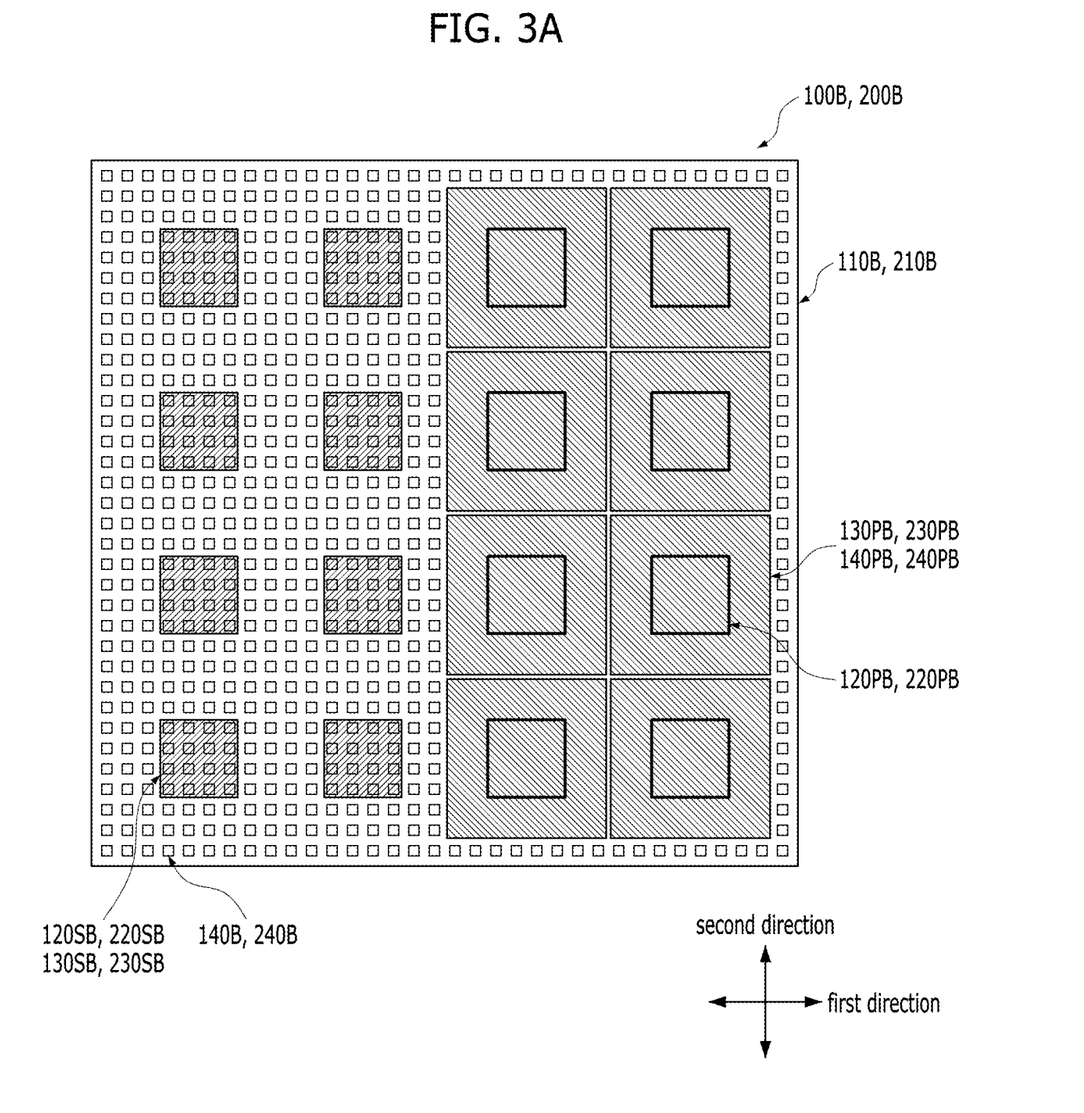
FIG. 3A is a plan view schematic illustrating a semiconductor device according to another embodiment of the present disclosure.
Figure 3B:
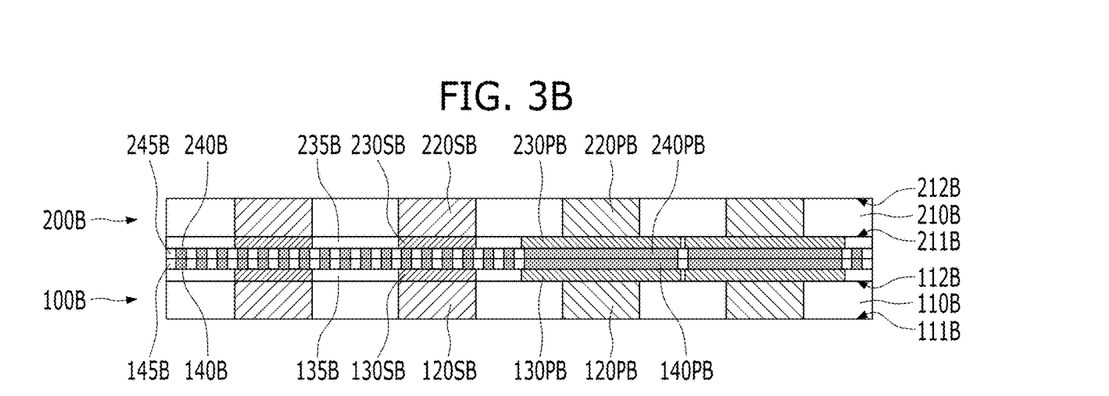
FIG. 3B is a cross-sectional view schematic of the semiconductor device of FIG. 3A in a first direction.

FIG. 3A is a plan view schematic illustrating a semiconductor device according to another embodiment of the present disclosure, and FIG. 3B is a cross-sectional view schematic of the semiconductor device of FIG. 3A in a first direction. Description of features already described in the previous embodiments may be omitted. Differences from the above-described embodiments will be mainly described.

Referring to FIGS. 3A and 3B, the semiconductor device of the present embodiment may include a first semiconductor structure 100B and a second semiconductor structure 200B stacked over of each other, for example, in a vertical direction.

The first semiconductor structure 100B may include a first substrate 110B, a first high-frequency signal through electrode 120SB, a first low-frequency signal through electrode 120PB, a first high-frequency signal conductive pattern 130SB, a first low-frequency signal conductive pattern 130PB, a first interlayer insulating layer 135B, a first connection electrode 140B, a first low-frequency signal connection electrode 140PB, and a first insulating layer 145B.

In the present embodiment, the first low-frequency signal connection electrode 140PB connected to the first low-frequency signal conductive pattern 130PB may have a different arrangement and area from that of the first connection electrode 140B. That is, unlike the above-described embodiment, one first low-frequency signal connection electrode 140PB having a flat plate shape may overlap and connect to one first low-frequency signal conductive pattern 130PB. In a plan view, the area of the first low-frequency signal connection electrode 140PB may be larger than the area of the first connection electrode 140B. Furthermore, in a plan view, the area of the first low-frequency signal connection electrode 140PB may be equal to or less than the area of the first low-frequency signal conductive pattern 130PB. Furthermore, in a plan view, the area of the first low-frequency signal connection electrode 140PB may be equal to or greater than the area of the first low-frequency signal through electrode 120PB.

Except for the first low-frequency signal connection electrode 140PB, the plurality of first connection electrodes 140B may be arranged in the first and second directions in the same manner as in the above-described embodiments. In this case, the contact area between one first high-frequency signal conductive pattern 130SB and the plurality of first connection electrodes 140B connected thereto may be smaller than the contact area between one first low-frequency signal conductive pattern 130PB and one first low-frequency signal connection electrode 140PB connected thereto.

The second semiconductor structure 200B may include a second substrate 210B, a second high-frequency signal through electrode 220SB, a second low-frequency signal through electrode 220PB, a second high-frequency signal conductive pattern 230SB, a second low-frequency signal conductive pattern 230PB, a second interlayer insulating layer 235B, a second connection electrode 240B, a second low-frequency signal connection electrode 240PB, and a second insulating layer 245B.

In the present embodiment, the second low-frequency signal connection electrode 240PB connected to the second low-frequency signal conductive pattern 230PB may have a different arrangement and area from that of the second connection electrode 240B. That is, unlike the above-described embodiments, one second low-frequency signal connection electrode 240PB having a flat plate shape may overlap and connect to one second low-frequency signal conductive pattern 230PB. In a plan view, the area of the second low-frequency signal connection electrode 240PB may be larger than the area of the second connection electrode 240B. Furthermore, in a plan view, the area of the second low-frequency signal connection electrode 240PB may be equal to or less than the area of the second low-frequency signal conductive pattern 230PB. Furthermore, in a plan view, the area of the second low-frequency signal connection electrode 240PB may be equal to or greater than the area of the second low-frequency signal through electrode 220PB.

Except for the second low-frequency signal connection electrode 240PB, the plurality of second connection electrodes 240B may be arranged in the first and second directions in the same manner as in the above-described embodiments. In this case, the contact area between one second high-frequency signal conductive pattern 230SB and the plurality of second connection electrodes 240B connected thereto may be smaller than the contact area between one second low-frequency signal conductive pattern 230PB and one second low-frequency signal connection electrode 240PB connected thereto.

Meanwhile, in the present embodiment, the case where the first low-frequency signal connection electrode 140PB and the second low-frequency signal connection electrode 240PB have the same flat plate shape is illustrated, but the present disclosure is not limited thereto. The first low-frequency signal connection electrode 140PB may be omitted and the first connection electrodes 140B may be arranged in the corresponding region, or the second low-frequency signal connection electrode 240PB may be omitted and the second connection electrodes 240B may be arranged in the corresponding region.

Figure 4:
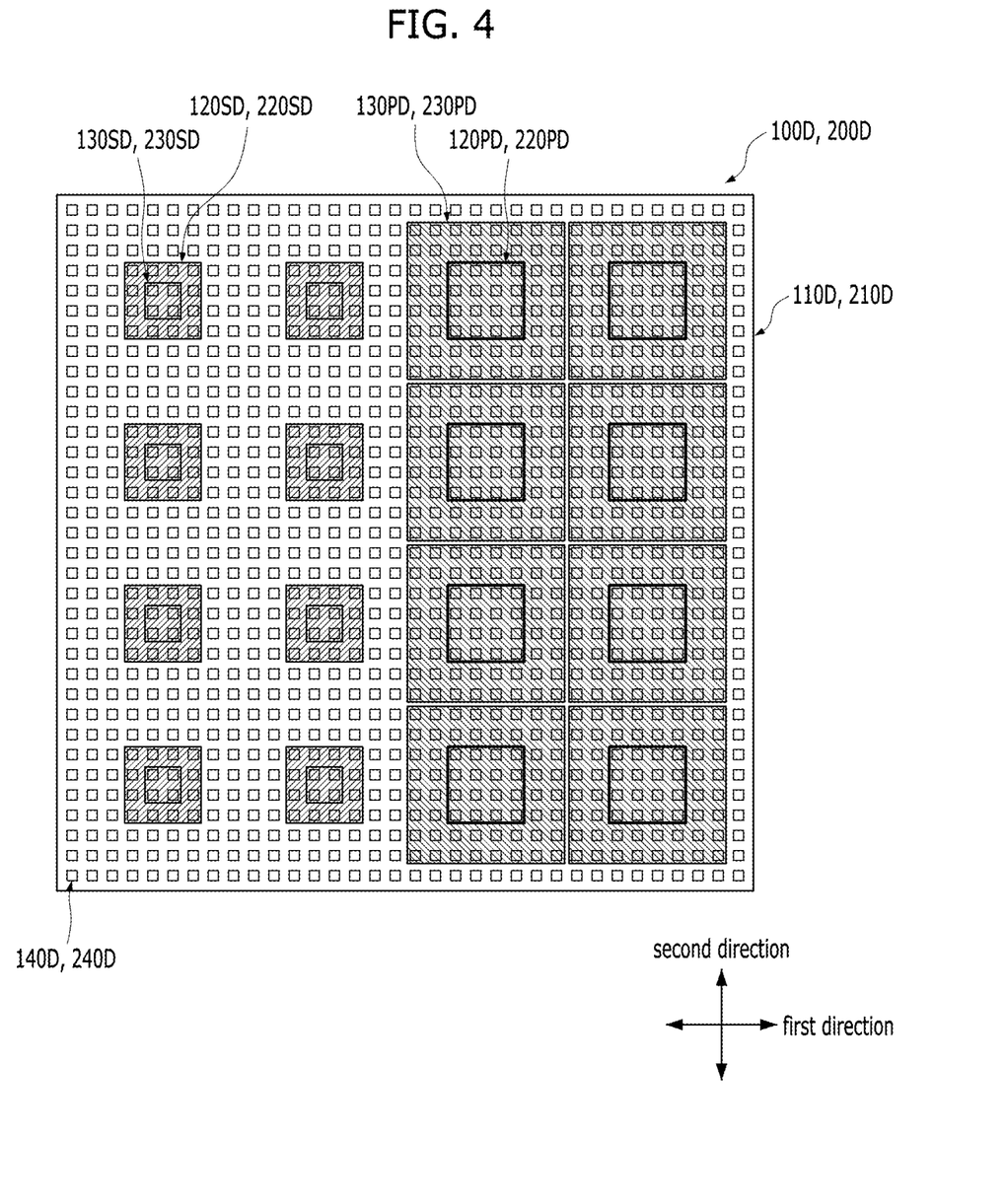
FIG. 4 is a plan view schematic illustrating a semiconductor device according to another embodiment of the present disclosure.

FIG. 4 is a plan view schematic illustrating a semiconductor device according to another embodiment of the present disclosure. Differences from the above-described embodiments will be mainly described.

Referring to FIG. 4, the semiconductor device of the present embodiment may include a first semiconductor structure 100D and a second semiconductor structure 200D.

The first semiconductor structure 100D may include a first substrate 110D, a first high-frequency signal through electrode 120SD, a first low-frequency signal through electrode 120PD, a first high-frequency signal conductive pattern 130SD, a first low-frequency signal conductive pattern 130PD, and a first connection electrode 140D.

In the present embodiment, the first high-frequency signal conductive pattern 130SD may have the same shape as the first high-frequency signal through electrode 120SD, and may have a smaller area than the first high-frequency signal through electrode 120SD in a plan view. In this case, the number of the first connection electrodes 140D connected to the first high-frequency signal conductive pattern 130SD may be further reduced compared to the above-described embodiments, and thus the capacitance of the signal transmission path may be further reduced. As an example, four first connection electrodes 140D may be connected to the first high-frequency signal conductive pattern 130SD.

The second semiconductor structure 200D may include a second substrate 210D, a second high-frequency signal through electrode 220SD, a second low-frequency signal through electrode 220PD, a second high-frequency signal conductive pattern 230SD, a second low-frequency signal conductive pattern 230PD, and a second connection electrode 240D.

In the present embodiment, the second high-frequency signal conductive pattern 230SD may have the same shape as the second high-frequency signal through electrode 220SD, and may have a smaller area than the second high-frequency signal through electrode 220SD in a plan view. In this case, the number of second connection electrodes 240D connected to the second high-frequency signal conductive pattern 230SD may be further reduced compared to the above-described embodiments, and thus the capacitance of the signal transmission path may be further reduced. As an example, four second connection electrodes 240D may be connected to the second high-frequency signal conductive pattern 230SD.

Meanwhile, in the present embodiment, the case where the first high-frequency signal conductive pattern 130SD and the second high-frequency signal conductive pattern 230SD have the same area is illustrated, but the present disclosure is not limited thereto. On the premise that the first high-frequency signal conductive pattern 130SD and the second high-frequency signal conductive pattern 230SD have the area equal to or less than the area of the first high-frequency signal through electrode 120SD and the second high-frequency signal through electrode 220SD, respectively, the areas of the first high-frequency signal conductive pattern 130SD and the second high-frequency signal conductive pattern 230SD may be different from each other.

Figure 5:
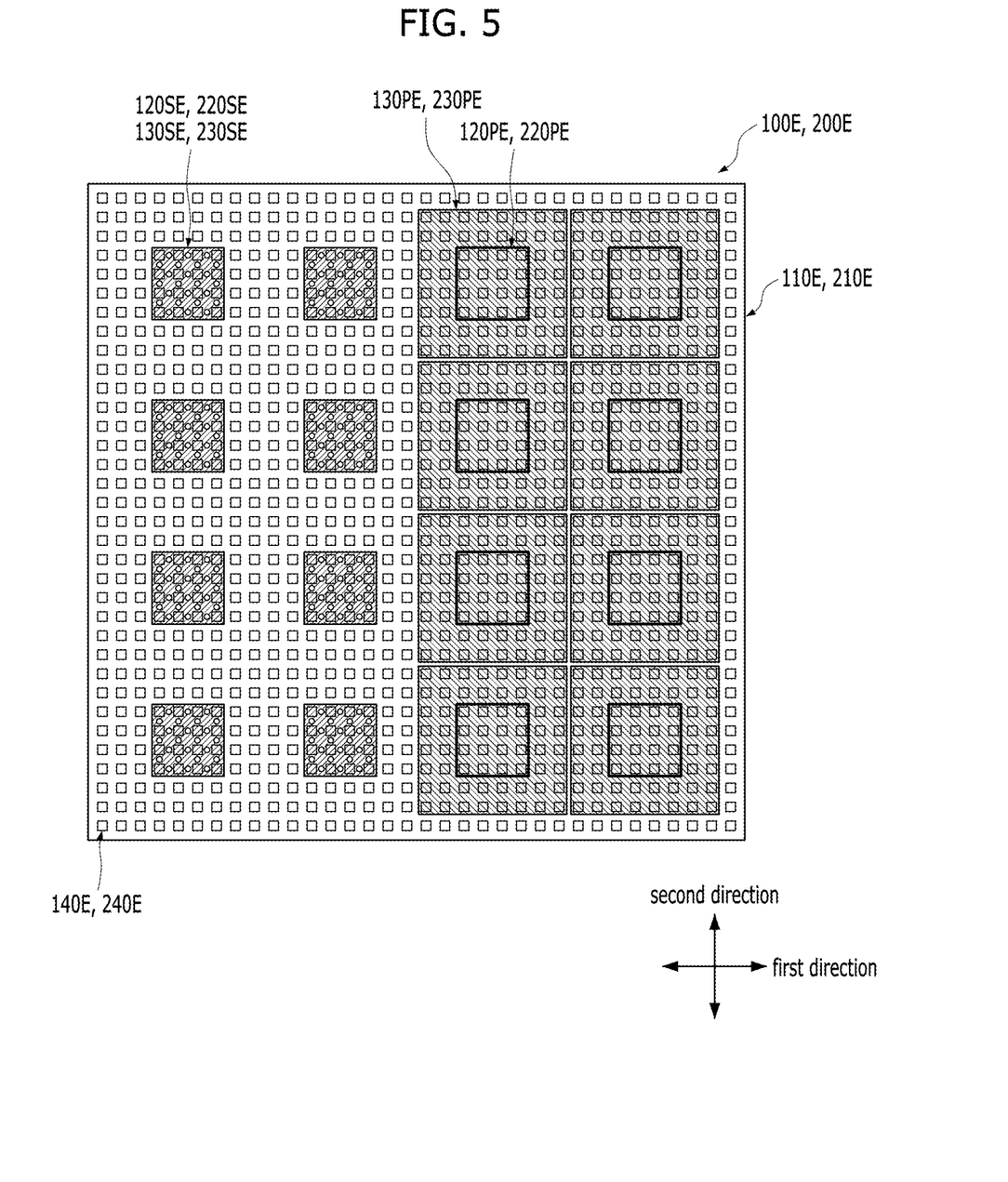
FIG. 5 is a plan view schematic illustrating a semiconductor device according to another embodiment of the present disclosure.

FIG. 5 is a plan view schematic illustrating a semiconductor device according to another embodiment of the present disclosure. Differences from the above-described embodiments will be mainly described.

Referring to FIG. 5, the semiconductor device of the present embodiment may include a first semiconductor structure 100E and a second semiconductor structure 200E.

The first semiconductor structure 100E may include a first substrate 110E, a first high-frequency signal through electrode 120SE, a first low-frequency signal through electrode 120PE, a first high-frequency signal conductive pattern 130SE, a first low-frequency signal conductive pattern 130PE, and a first connection electrode 140E. Here, the first high-frequency signal conductive pattern 130SE may have a lattice shape.

The second semiconductor structure 200E may include a second substrate 210E, a second high-frequency signal through electrode 220SE, a second low-frequency signal through electrode 220PE, a second high-frequency signal conductive pattern 230SE, a second low-frequency signal conductive pattern 230PE, and a second connection electrode 240E. Here, the second high-frequency signal conductive pattern 230SE may have a lattice shape.

Meanwhile, in the present embodiment, the case where the first high-frequency signal conductive pattern 130SE and the second high-frequency signal conductive pattern 230SE have the same lattice shape has been described, but the present disclosure is not limited thereto. The first high-frequency signal conductive pattern 130SE and the second high-frequency signal conductive pattern 230SE may have different shapes. For example, any one of the first high-frequency signal conductive pattern 130SE and the second high-frequency signal conductive pattern 230SE may have a flat plate shape.

Figure 6:
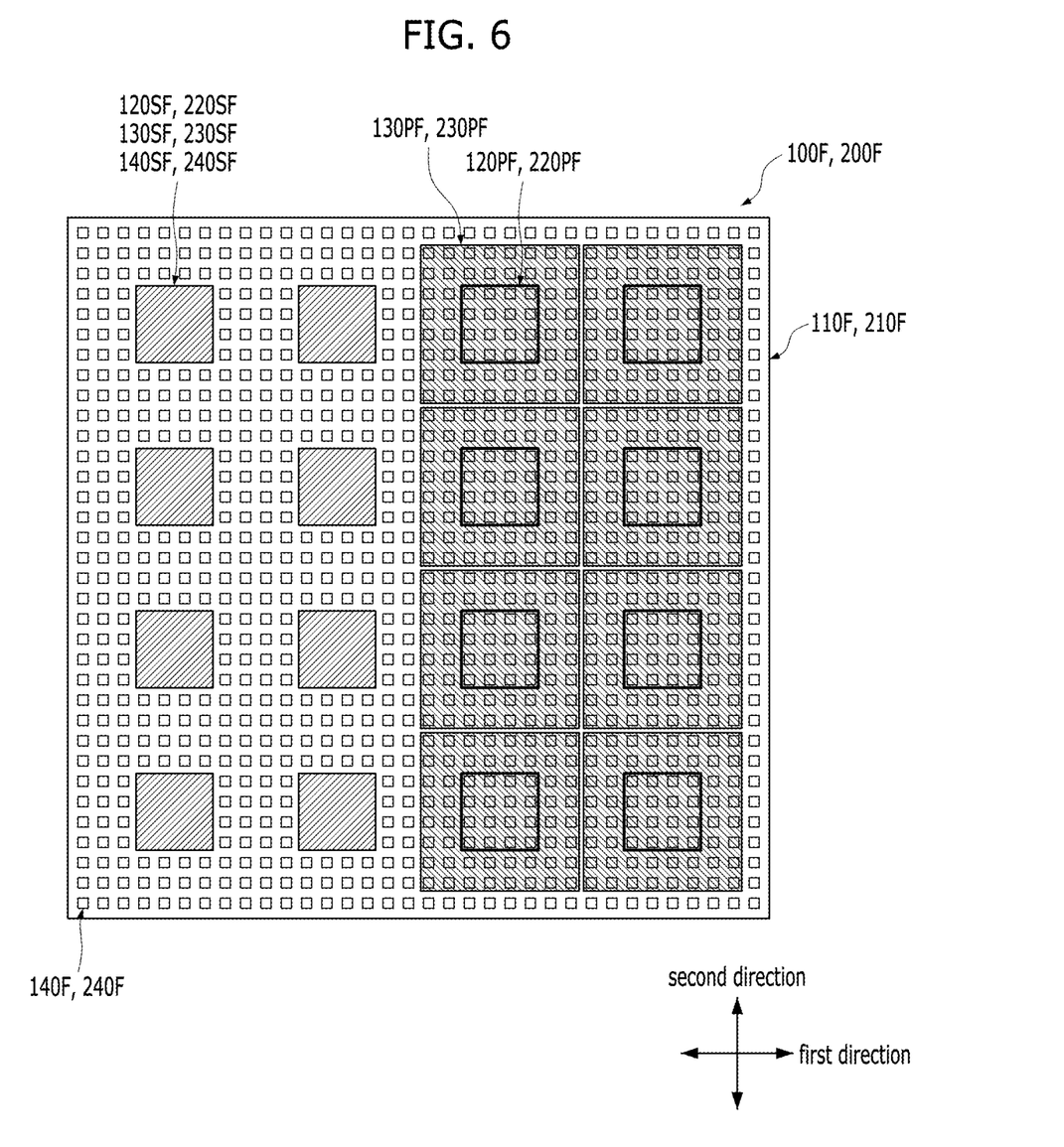
FIG. 6 is a plan view schematic illustrating a semiconductor device according to another embodiment of the present disclosure.

FIG. 6 is a plan view schematic illustrating a semiconductor device according to another embodiment of the present disclosure. Differences from the above-described embodiments will be mainly described.

Referring to FIG. 6, the semiconductor device of the present embodiment may include a first semiconductor structure 100F and a second semiconductor structure 200F.

The first semiconductor structure 100F may include a first substrate 110F, a first high-frequency signal through electrode 120SF, a first low-frequency signal through electrode 120PF, a first high-frequency signal conductive pattern 130SF, a first low-frequency signal conductive pattern 130PF, a first high-frequency signal connection electrode 140SF, and a first connection electrode 140F.

In the present embodiment, the first high-frequency signal connection electrode 140SF may have a different arrangement and area from the first connection electrode 140F. That is, unlike the above-described embodiments, one first high-frequency signal connection electrode 140SF having a flat plate shape may overlap and connect to one first high-frequency signal conductive pattern 130SF. In a plan view, the area of the first high-frequency signal connection electrode 140SF may be larger than the area of the first connection electrode 140F. Furthermore, in a plan view, the area of the first high-frequency signal connection electrode 140SF may be equal to or less than the area of the first high-frequency signal conductive pattern 130SF. Even in this case, the contact area between the first high-frequency signal connection electrode 140SF and the first high-frequency signal conductive pattern 130SF may be smaller than the contact area between the first connection electrode 140F and the first low-frequency signal conductive pattern 130PF.

The second semiconductor structure 200F may include a second substrate 210F, a second high-frequency signal through electrode 220SF, a second low-frequency signal through electrode 220PF, a second high-frequency signal conductive pattern 230SF, a second low-frequency signal conductive pattern 230PF, a second high-frequency signal connection electrode 240SF, and a second connection electrode 240F.

In the present embodiment, the second high-frequency signal connection electrode 240SF may have a different arrangement and area from the second connection electrode 240F. That is, unlike the above-described embodiments, one second high-frequency signal connection electrode 240SF having a flat plate shape may overlap and connect to one second high-frequency signal conductive pattern 230SF. In a plan view, the area of the second high-frequency signal connection electrode 240SF may be larger than the area of the second connection electrode 240F. Furthermore, in a plan view, the area of the second high-frequency signal connection electrode 240SF may be equal to or less than the area of the second high-frequency signal conductive pattern 230SF. Even in this case, the contact area between the second high-frequency signal connection electrode 240SF and the second high-frequency signal conductive pattern 230SF may be smaller than the contact area between the second connection electrode 240F and the second low-frequency signal conductive pattern 230PF.

In the present embodiment, the case where the first high-frequency signal connection electrode 140SF and the second high-frequency signal connection electrode 240SF have the same flat plate shape is illustrated, but the present disclosure is not limited thereto. The first high-frequency signal connection electrode 140SF may be omitted and the first connection electrodes 140F may be arranged in the corresponding region, or the second high-frequency signal connection electrode 240SF may be omitted and the second connection electrodes 240F may be arranged in the corresponding region.

The embodiments described above may be variously modified or combined on the assumption that the area of the low-frequency signal conductive pattern connected to the low-frequency signal through electrode is larger than the area of the high-frequency signal conductive pattern connected to the high-frequency signal through electrode, so that the contact area between the low-frequency signal conductive pattern and the connection electrode is larger than the contact area between the high-frequency signal conductive pattern and the connection electrode. Accordingly, the power supply capability of the semiconductor device may be improved, and high speed signal transmission may be possible.

According to the above embodiments of the present disclosure, it may be possible to provide a semiconductor structure capable of reducing capacitance of a signal transmission path and resistance of a power supply path, and a semiconductor device including the same.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
   a first substrate;
   a first high-frequency signal through electrode and a first low-frequency signal through electrode passing through the first substrate;
   a first high-frequency signal conductive pattern and a first low-frequency signal conductive pattern respectively connected to the first high-frequency signal through electrode and the first low-frequency signal through electrode; and
   one or more first high-frequency signal connection electrodes and one or more first low-frequency signal connection electrodes respectively connected to the first high-frequency signal conductive pattern and the first low-frequency signal conductive pattern,
   wherein an area of the first low-frequency signal conductive pattern is larger than an area of the first high-frequency signal conductive pattern.

2. The semiconductor device according to claim 1, wherein a contact area between the first low-frequency signal conductive pattern and the first low-frequency signal connection electrode is larger than a contact area between the first high-frequency signal conductive pattern and the first high-frequency signal connection electrode.

3. The semiconductor device according to claim 1, wherein the number of the first low-frequency signal connection electrodes is greater than the number of the first high-frequency signal connection electrodes.

4. The semiconductor device according to claim 3, wherein an area and pitch of the first high-frequency signal connection electrode are the same as an area and pitch of the first low-frequency signal connection electrode.

5. The semiconductor device according to claim 1, wherein an area of the first low-frequency signal connection electrode is larger than an area of the first high-frequency signal connection electrode.

6. The semiconductor device according to claim 1, wherein each of the first high-frequency signal conductive pattern and the first low-frequency signal conductive pattern has a flat plate shape or a lattice shape in which a plurality of holes are formed in a flat plate.

7. The semiconductor device according to claim 1, wherein the first low-frequency signal conductive pattern is connected to a plurality of first low-frequency signal connection electrodes arranged in a matrix form, and
   the first high-frequency signal conductive pattern is connected to a plurality of first high-frequency signal connection electrodes arranged in a matrix form.

8. The semiconductor device according to claim 1, wherein the first low-frequency signal conductive pattern is connected to one first low-frequency signal connection electrode having a flat plate shape, and
   the first high-frequency signal conductive pattern is connected to a plurality of first high-frequency signal connection electrodes arranged in a matrix form.

9. The semiconductor device according to claim 1, wherein the first low-frequency signal conductive pattern is connected to one first low-frequency signal connection electrode having a flat plate shape, and
   the first high-frequency signal conductive pattern is connected to one first high-frequency signal connection electrode having a flat plate shape.

10. The semiconductor device according to claim 1, wherein the first low-frequency signal conductive pattern is connected to a plurality of first low-frequency signal connection electrodes arranged in a matrix form, and
    the first high-frequency signal conductive pattern is connected to one first high-frequency signal connection electrode having a flat plate shape.

11. The semiconductor device according to claim 1, wherein an area of the first low-frequency signal conductive pattern is larger than an area of the first low-frequency signal through electrode.

12. The semiconductor device according to claim 1, wherein an area of the first high-frequency signal conductive pattern is equal to or less than an area of the first high-frequency signal through electrode.

13. The semiconductor device according to claim 1, wherein the first substrate, the first high-frequency signal through electrode, the first low-frequency signal through electrode, the first high-frequency signal conductive pattern, the first low-frequency signal conductive pattern, the first high-frequency signal connection electrode, and the first low-frequency signal connection electrode form a first semiconductor structure, and
wherein the semiconductor device further comprises:
a second semiconductor structure disposed over or under the first semiconductor structure, and
wherein the second semiconductor structure includes:
a second substrate;
a second high-frequency signal through electrode and a second low-frequency signal through electrode passing through the second substrate;
a second high-frequency signal conductive pattern and a second low-frequency signal conductive pattern respectively connected to the second high-frequency signal through electrode and the second low-frequency signal through electrode; and
one or more second high-frequency signal connection electrodes and one or more second low-frequency signal connection electrodes respectively connected to the second high-frequency signal conductive pattern and the second low-frequency signal conductive pattern.

14. The semiconductor device according to claim 13, wherein an area of the second low-frequency signal conductive pattern is larger than an area of the second high-frequency signal conductive pattern.

15. The semiconductor device according to claim 13, wherein the one or more second high-frequency signal connection electrodes are respectively connected to the one or more first high-frequency signal connection electrodes, and
the one or more second low-frequency signal connection electrodes are respectively connected to the one or more first low-frequency signal connection electrodes.

16. The semiconductor device according to claim 15, wherein the second high-frequency signal connection electrode and the first high-frequency signal connection electrode form a metal-to-metal bonding, and
the second low-frequency signal connection electrode and the first low-frequency signal connection electrode form a metal-to-metal bonding.

17. The semiconductor device according to claim 16, wherein the first semiconductor structure further includes a first insulating layer filled between the first high-frequency signal connection electrode and the first low-frequency signal connection electrode,
the second semiconductor structure further includes a second insulating layer filled between the second high-frequency signal connection electrode and the second low-frequency signal connection electrode, and
the first insulating layer and the second insulating layer form an insulator-to-insulator bonding.

18. The semiconductor device according to claim 1, further comprising:
a first dummy connection electrode that is not connected to the first high-frequency signal conductive pattern and the first low-frequency signal conductive pattern.

19. The semiconductor device according to claim 1, wherein a high-frequency signal is transmitted through the first high-frequency signal through electrode, the first high-frequency signal conductive pattern, and the first high-frequency signal connection electrode, and
a low-frequency signal or power is transmitted through the first low-frequency signal through electrode, the first low-frequency signal conductive pattern, and the first low-frequency signal connection electrode.

20. A semiconductor device comprising:
a first substrate;
a first high-frequency signal through electrode and a first low-frequency signal through electrode passing through the first substrate;
a first high-frequency signal conductive pattern and a first low-frequency signal conductive pattern respectively connected to the first high-frequency signal through electrode and the first low-frequency signal through electrode; and
one or more first high-frequency signal connection electrodes and one or more first low-frequency signal connection electrodes respectively connected to the first high-frequency signal conductive pattern and the first low-frequency signal conductive pattern,
wherein a contact area between the first low-frequency signal conductive pattern and the first low-frequency signal connection electrode is larger than a contact area between the first high-frequency signal conductive pattern and the first high-frequency signal connection electrode.

* * * * *